United States Patent
Feng

(10) Patent No.: US 8,134,885 B2
(45) Date of Patent: Mar. 13, 2012

(54) HIGH-SPEED COMPRESSION ARCHITECTURE FOR MEMORY

(75) Inventor: Jeffrey T. Feng, Cambridge, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 296 days.

(21) Appl. No.: 12/625,034

(22) Filed: Nov. 24, 2009

(65) Prior Publication Data

US 2011/0121867 A1    May 26, 2011

(51) Int. Cl.
    *G11C 8/00*    (2006.01)
(52) U.S. Cl. ......... 365/230.08; 365/185.05; 365/189.08; 365/207
(58) Field of Classification Search ............ 365/185.05, 365/189.08, 207, 230.08
    See application file for complete search history.

(56) References Cited

U.S. PATENT DOCUMENTS

| 7,542,812 | B2 | 6/2009 | Stroili et al. |
| 7,707,467 | B2 * | 4/2010 | Louie et al. .................. 714/718 |
| 2002/0000837 | A1 | 1/2002 | Keeth et al. |
| 2002/0040420 | A1 | 4/2002 | Yamauchi et al. |
| 2008/0211636 | A1 | 9/2008 | O'Toole et al. |
| 2009/0254694 | A1 | 10/2009 | Ehrman et al. |

OTHER PUBLICATIONS

Manandhar et al.,"36-GHz, 16×16 Bit ROM in InP DHBT Technology Suitable for DDS Application", IEEE Journal of Solid-State Circuits, vol. 42, No. 2, Feb. 2007.
Turner, et al., "Direct Digital Synthesizer with Sine-Weighted DAC at 32-GHz Clock Frequency in InP DHBT Technology", IEEE Journal of Solid-State Circuits, vol. 41, No. 10, Oct. 2006.
Turner, "ROM-Based Direct Digital Synthesizer at 24 GHz Clock Frequency in InP DHBT Technology", IEEE Microwave and Wireless Components Letters, vol. 18, No. 8, Aug. 2008.

* cited by examiner

*Primary Examiner* — Hoai V Ho
(74) *Attorney, Agent, or Firm* — Finch & Maloney, PLLC; Neil F. Maloney

(57) ABSTRACT

Memory design techniques are disclosed that provide a high compression ratio at no loss in speed. The techniques can be embodied, for instance, in heterojunction bipolar transistor (HBT) based ROMs. By embedding compression logic (e.g., XOR) functionality directly into the address decoders and sense amplifiers of the memory device, a high compression ratio is achieved at no loss in speed. For example, the logic-based compression functionality can be directly implemented into the buffers that form the address decoder as well as the sense amplifiers.

20 Claims, 7 Drawing Sheets

HIGH-SPEED COMPRESSION ARCHITECTURE FOR MEMORY

STATEMENT OF GOVERNMENT INTEREST

The invention was made with United States Government support under contract DAAD17-02-C-0115 awarded by the Army, and the United States Government has certain rights in this invention.

FIELD OF THE INVENTION

The invention relates to integrated circuitry, and more particularly, to memory arrays.

BACKGROUND OF THE INVENTION

The demand for increased functionality and high-speeds in circuits such as direct digital synthesizers (DDS) necessitates faster memory circuit architectures, such as read only memory (ROM). For instance, heterojunction bipolar transistor (HBT) based ROMs commonly cascade an array of logic gates in front of a buffer-based address decoder and after the sense amplifier array of the word decoder to effect a compression ratio for the ROM. In general, compression enables among other things increased speed and decreased die size. However, there are a number of issues associated with such conventional ROM architectures. For instance, the addition of such logic stages significantly reduces the maximum speed of the ROM. In addition, the added circuitry increases the overall size and power usage of the circuit.

SUMMARY OF THE INVENTION

One embodiment of the present invention provides a memory device including a memory cell array including rows and columns of bit cells for storing bit data. The device further includes an address decoder having a plurality of buffers each operatively coupled to a corresponding row decoder configured for selecting a corresponding row of the memory cell array, each address decoder buffer configured with an integrated address reversal function. The device further includes a sense amplifier having a plurality of buffers each operatively coupled to a corresponding column of the memory cell array, each sense amplifier buffer configured with an integrated sign-inversion function. The integrated address reversal and sign-inversion functions enable an X:1 compression ratio for the memory device with no increase in access time (relative to memory with no compression function), where X is greater than 1. The integrated address reversal function of each address decoder buffer can be implemented, for example, with an XOR logic function. The integrated sign-inversion function of each sense amplifier buffer can be implemented, for example, with an XOR logic function. In one specific example case, the integrated address reversal function of each address decoder buffer is implemented with a Gilbert cell configuration. In another specific example case, the integrated sign-inversion function of each sense amplifier buffer is implemented with a Gilbert cell configuration. In another specific example case, the integrated address reversal and sign-inversion functions enable a 4:1 compression ratio based on quadrant symmetry of signal stored at the provided memory address. In another specific example case, the device is a differential non-volatile memory (such as ROM; alternatively, could be volatile, such as RAM). In another specific example case, the device is included in a system-on-chip configuration. In another specific example case, the device is included in a digital signal generation system (such as a DDS or other frequency synthesizer).

A number of variations will be apparent in light of this disclosure. A memory device configured in accordance with another embodiment of the present invention includes a memory cell array including rows and columns of bit cells for storing bit data, an address decoder having a plurality of buffers each operatively coupled to a corresponding row decoder configured for selecting a corresponding row of the memory cell array, each address decoder buffer configured with an integrated address reversal function that is implemented with an XOR logic function, and a sense amplifier having a plurality of buffers each operatively coupled to a corresponding column of the memory cell array, each sense amplifier buffer configured with an integrated sign-inversion function that is implemented with an XOR logic function. In this particular example, the integrated address reversal and sign-inversion functions enable a 4:1 compression ratio for the memory device with no increase in access time. In one such case, the integrated address reversal function of each address decoder buffer is implemented with a Gilbert cell configuration. In another such case, the integrated sign-inversion function of each sense amplifier buffer is implemented with a Gilbert cell configuration. In another such case, the device is a differential non-volatile memory. In another such case, the device is included in a system-on-chip configuration.

Another embodiment of the present invention provides a system that includes a direct digital synthesizer (DDS) operatively coupled with a memory device. The memory can be configured, for example, as previously described. In one such case, the device is implemented as a system-on-chip configuration.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Memory design techniques are disclosed that provide a high compression ratio at no loss in speed. The techniques can be embodied, for instance, in heterojunction bipolar transistor (HBT) based ROMs.

General Overview

It has been found that the addition of a parallel array of exclusive OR (XOR) gates both before the buffer-based address decoder and after the sense amplifier array of the word decoder is effective for increasing the compression ratio of a ROM. In DDS applications, for instance, where the ROM is storing phase-to-amplitude conversion data and where the output signal has quadrant symmetry, this technique quadruples the compression ratio of the ROM (i.e., 4:1). However, this increase in compression ratio comes at the expense of two additional gate delays by the addition of the XOR gates, thereby slowing operating frequency of the ROM.

In accordance with an embodiment of the present invention, by embedding XOR functionality directly into the address decoders and word decoders of HBT-based ROMs, a 4:1 compression ratio is obtained with no loss in speed for the ROM. For example, the XOR functionality can be directly implemented into the buffers that form the address decoder as well as the sense amplifiers that form the word decoder. Additionally, this technique saves power and chip area relative to a configuration where respective arrays of XOR gates are cascaded before the buffers of the address decoder and after the sense amplifiers of the word decoders.

As will be apparent in light of this disclosure, the memory devices provided herein can be implemented in various configurations, such as an HBT-based ROM, and are suitable for any number of applications, whether volatile or non-volatile, including integrated system-on-chip configurations as well as printed circuit boards configured with various discrete components including memory devices.

The memories provided herein are particularly suitable for high-speed DDSs, such as those operating in the 20 to 40 GHz range. These DDSs can be used, for example, as fast, agile local oscillator generators and jammers for system-on-chip applications in commercial and military platforms. Numerous other applications will be apparent in light of this disclosure.

Memory Architecture

Figure 1:
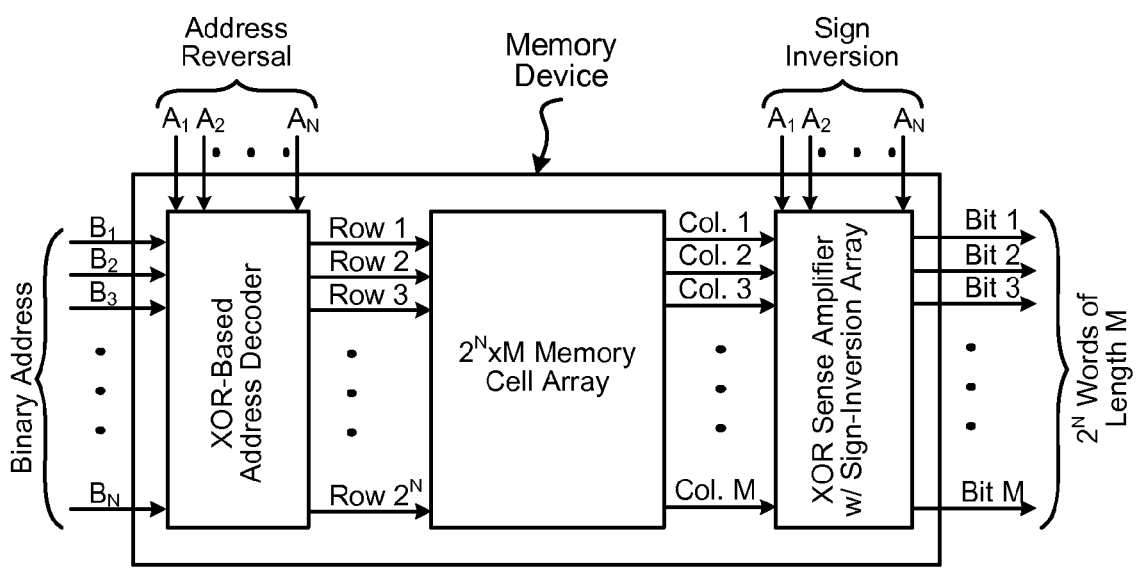
FIG. 1 is a block diagram of a memory device configured in accordance with one embodiment of the present invention.

FIG. 1 is a block diagram of a memory device configured in accordance with one embodiment of the present invention. As can be seen, the device includes a $2^N \times M$ memory cell array, an XOR-based address decoder, and an XOR sense amplifier configured with a sign-inversion array. For purposes of discussion, assume the $2^N \times M$ memory cell array is a differential ROM memory cell array, although other memory types can be implemented here as well (e.g., random access memory, RAM).

The XOR-based address decoder generally includes XOR-based buffers operatively coupled to row decoders, each of which will be discussed in further detail with reference to FIGS. 2 and 3, respectively. In operation, a binary address $(B_1, B_2, \ldots, B_N)$ of a memory location to be read is provided to the XOR-based address decoder. In one example embodiment, the address inputs are provided differentially, although non-differential configurations will be apparent in light of this disclosure. As will be discussed in turn, the address reversal input $(A_1, A_2, \ldots, A_N)$ can be used to enable address-inversion differentially with respect to the corresponding binary address signals $(B_1, B_2, \ldots, B_N)$. The single-ended outputs from each of the XOR-based address decoder buffers feed a row decoder circuit. For example, the row decoder circuit output will be high (or otherwise active) when all inputs from its corresponding XOR-based address decoder buffers are logic high.

The $2^N \times M$ memory cell array is in turn driven by a single-ended row decoder circuit outputs. Thus, a corresponding row (Row 1, Row 2, ..., Row $2^N$) of the memory cell array is selected for sensing by the XOR sensing amplifier configured with the sign-inversion array. The memory cell array can be implemented as a differential ROM memory cell array. However, other embodiments can be configured with any number of suitable memory cell array architectures including non-differential designs, so long as those array designs can be configured with address decoder buffer and sense amplifiers as described herein. In any case, the array generally includes rows and columns, and based on the selected row, all the columns (col. 1, col. 2, ..., col. M) of that row (or some subset thereof, if column selection is configured) can be readout via corresponding sense amplifiers. Additional details of the $2^N \times M$ memory cell array will be discussed in further detail with reference to FIG. 4.

The XOR sense amplifier configured with sign-inversion array receives the M bit signals of column data (col. 1, col. 2, ..., col. M) from the selected row, amplifies those signals accordingly, and outputs in this example case a $2^N$ words of length M (bit 1, bit 2, ..., bit M). Just as with the memory cell array and the address decoder, the sense amplifier can be implemented with differential circuitry. By integrating an XOR function into the load of the sense amplifiers, differential sign-swapping capability is added with no penalty in speed. Other embodiments may be implemented with non-differential circuitry if so desired, as will be apparent in light of this disclosure. Additional details of the XOR sense amplifier configured with sign-inversion array will be discussed in further detail with reference to FIG. 5.

Note that the embedded XOR functionality in the address decoder and the sense amplifiers reduces the access time of the ROM by two gate delays, relative to configurations where compression logic is discretely implemented before the buffer-based address decoder and after the sense amplifier array of the word decoder. Further note that the logic gates can be implemented with any suitable technology, such as transistor-transistor logic (TTL) or emitter-coupled logic (ECL). Moreover, logic functions other than XOR, such as AND, OR, NAND, and NOR, can be implemented in the load of the sense amplifiers, as will be apparent in light of this disclosure.

Address Decoder

Figure 2:
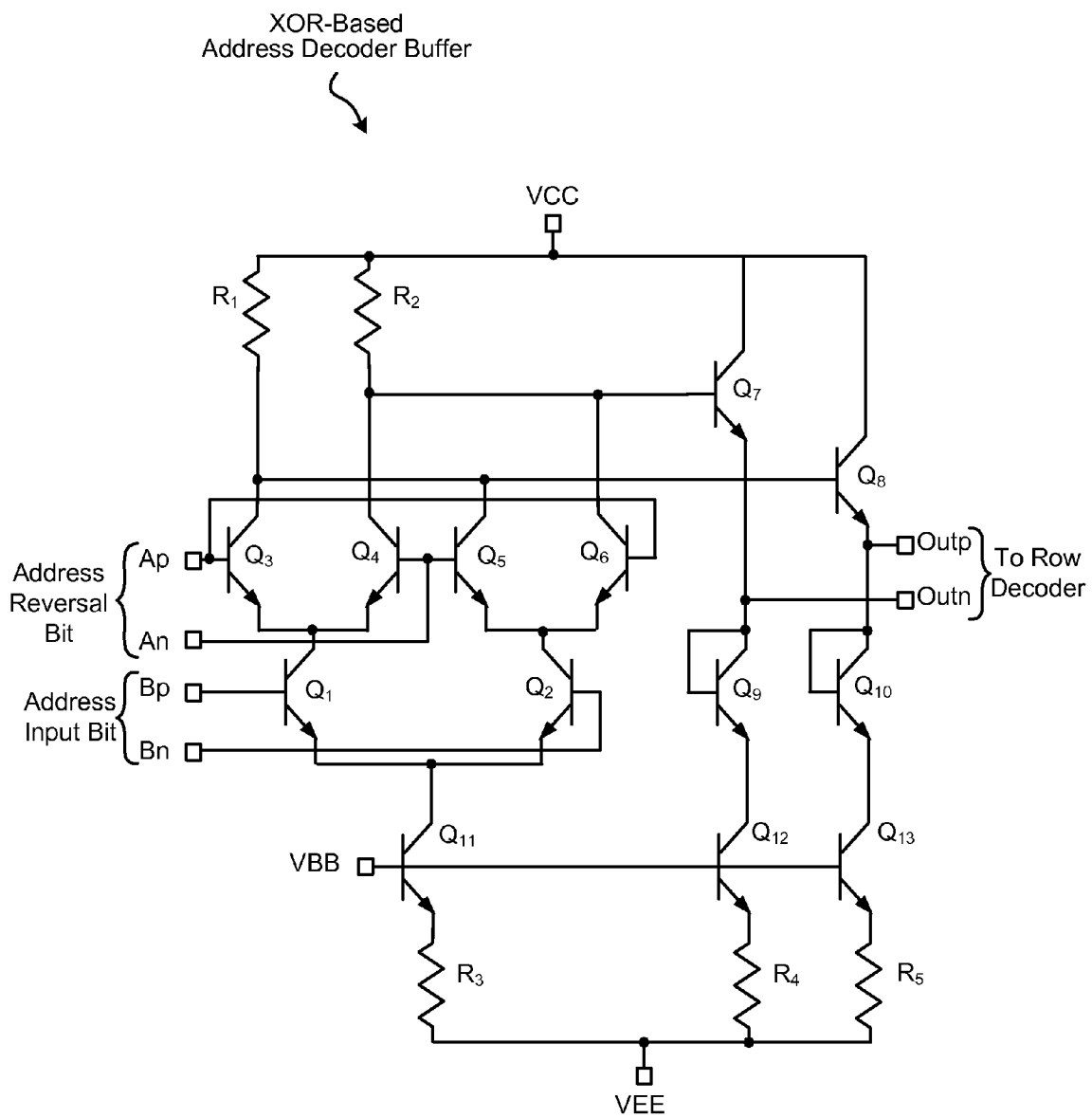
FIG. 2 is a schematic diagram of an address decoder buffer configured with XOR functionality, in accordance with one embodiment of the present invention.

FIG. 2 is a schematic diagram of an address decoder buffer configured with XOR functionality, in accordance with one embodiment of the present invention. As will be appreciated, any number of these buffers can be used, depending on the number of address bits to be decoded.

In this example embodiment, the corresponding address input bit B comes in differentially on Bp and Bn (the base of Q1 and Q2 respectively). The output of the buffer is also provided differentially, at Outp and Outn. Note that the differential output of the buffer can be taken as a single-ended output (e.g., by taken Outp with reference to ground), if so desired. The compression logic is effectively implemented with XOR logic using transistors Q3-Q6, and enables an integrated address reversal function in the address decoder buffer. The XOR function in this example embodiment is implemented using a Gilbert cell configuration. However, other configurations may implement the XOR function with other logic functions, such as AND/OR-gates or NAND-gate, as will be apparent in light of this disclosure.

The address reversal input bit A is also received differentially on Ap and An, and can be used to perform address-inversion differentially with respect to the signal on Bp and Bn. For instance, if input B is high (Bp high, Bn low) and input A is low (Ap low, An high), then the buffer output will be high (Outp high, Outn low) and no address-inversion is performed. This is because transistors Q1, Q4, and Q5 will be turned on, which draws current through R2, lowering the voltage on the base of transistor Q7 and the emitter of Q7 (Outn). Resistor R1, on the other hand, will not have current going through it (because transistors Q3 and Q6 are turned off), which means the base and emitter of transistor Q8 will be at a higher voltage than the base and emitter of transistor Q7.

Likewise, if input B is high (Bp high, Bn low) and input A is high (Ap high, An low), then the buffer output will be low (Outp low, Outn high), and the output relative to the input is inverted (providing address reversal). This is because transistors Q1, Q3, and Q6 will be turned on, which draws current through R1, lowering the voltage on the base of transistor Q8 and the emitter of Q8 (Outn). Resistor R2, on the other hand, will not have current going through it (because transistors Q4 and Q5 are turned off), which means the base and emitter of transistor Q7 will be at a higher voltage than the base and emitter of transistor Q8.

Therefore, when an array of these XOR address decoder buffers is provided for a multi-bit input, the complimentary binary address can be provided by the circuit. For instance, for a binary address input of 0010, an output of 1101 can be provided by setting the Ap/An input of each buffer high (address-inversion enabled). To disable address-inversion, the Ap/An input of each buffer can be set low. As can further be seen, resistors R3, R4, and R5, along with transistors Q9, Q10, Q11, Q12, and Q13 and sources VCC, VEE, and VBB provide circuit biasing. As will be appreciated in light of this disclosure, address-inversion is particularly useful when mapping quadrant I sine-wave data to quadrant II sine-wave data and quadrant IV sine-wave data.

The transistors Q1 through Q13 shown in this example are bipolar NPN transistors, but other transistor types (e.g., BJT PNP, FETs) can be used, as will be apparent in light of this disclosure. The resistors can be implemented, for example, with thick or thin film. In a more general sense, the transistors and resistors can be implemented with any suitable technology, whether discrete components on a printed circuit board or integrated on an integrated circuit chip or chip set. As previously explained, higher speed ROM circuits (e.g., in excess of 10 GHz) can be implemented in heterojunction bipolar transistor (HBT) technology, but if such high speeds are not necessary (e.g., less than 2 GHz), then other technologies such as CMOS can be utilized. Any number of suitable implementation technologies can be used here.

Figure 3:
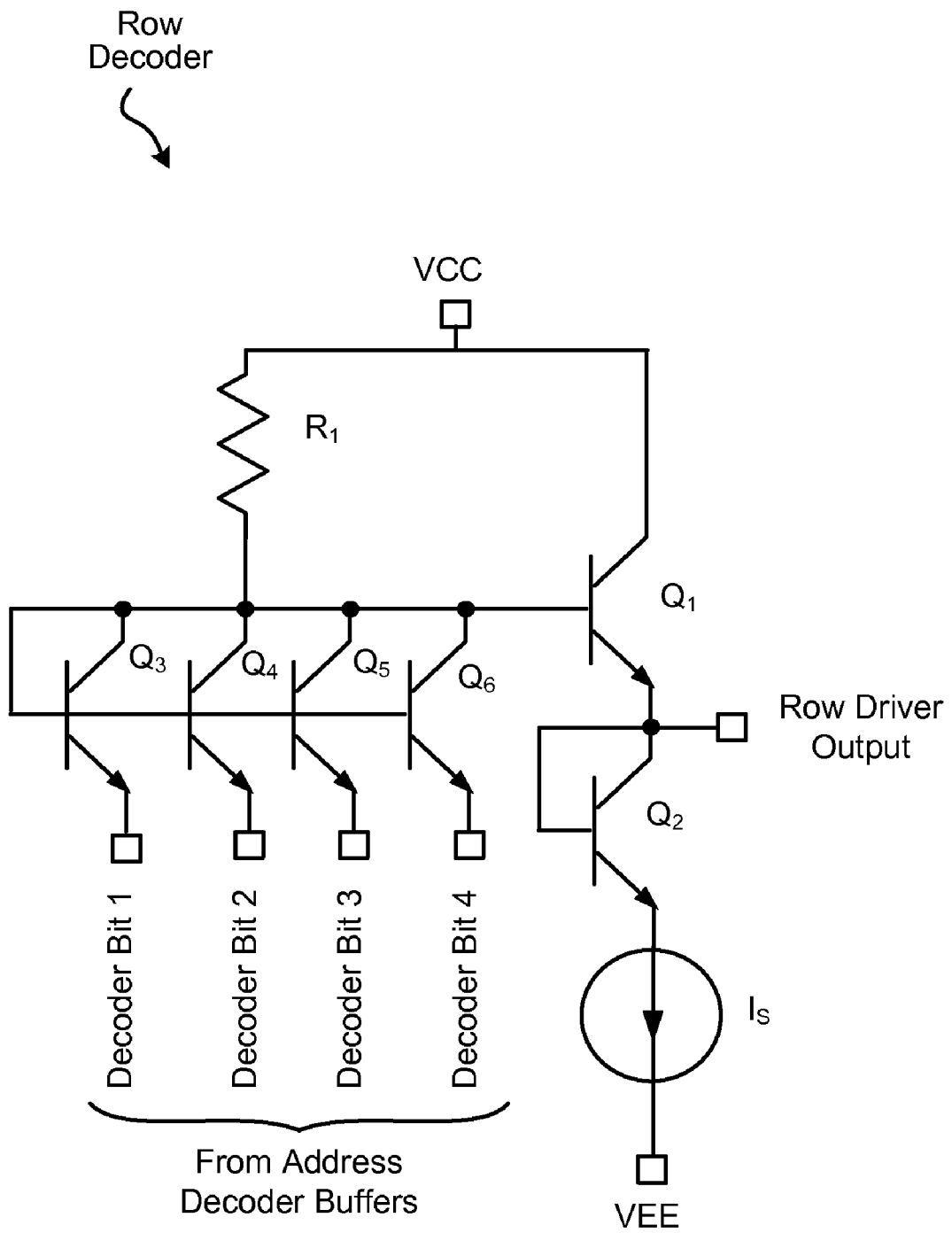
FIG. 3 is a schematic diagram of a row decoder configured in accordance with one embodiment of the present invention.

FIG. 3 is a schematic diagram of an example row decoder that can be used in conjunction with the address decoder buffer shown in FIG. 2, in accordance with one embodiment of the present invention. As will be appreciated, the circuit shown represents a single row of the row decoder, which can be duplicated as needed to provide a $2^N$ row array.

As can be seen, a 4-emitter transistor AND-gate comprised of Q3, Q4, Q5, and Q6 receives single-ended inputs from the decoder buffer output (e.g., Outp or Outn, referenced to ground) shown in FIG. 2. The base of the AND-gate is biased from the collector and transistor Q1. In operation, if all the decoder bits (1 through 4, in this example) from the corresponding address decoder buffers are at a high voltage, then no current flows through resistor R1 and the base and emitter of Q1 are at a high voltage (logic high). However, if any one or more of the decoder bits are at a low voltage, then current is drawn through resistor R1, and the base and emitter of transistor Q1 are brought to a lower voltage (logic low). Transistor Q2 and current source $I_S$, along with VCC and VEE, provide circuit biasing.

Thus, if all decoder bits are high, then the row driver output will be high allowing for selection of the corresponding row. Otherwise, if any decoder bit is low, then the row driver output will be low. As such, the corresponding row will not be selected (or will be de-selected). Only one row is selected at a time, allowing access to all columns of that row. The previous discussion with reference to the circuitry of FIG. 2, regarding how the components can be implemented with any suitable technology (e.g., HBT, CMOS, etc) as well as the particular implementation (e.g., system-on-chip or discrete components), is equally applicable here.

As will be appreciated, any number of conventional or custom row decoders can be used here, and the present invention is not intended to be limited to any particular row decoder implementation.

Memory Cell Array

Figure 4:
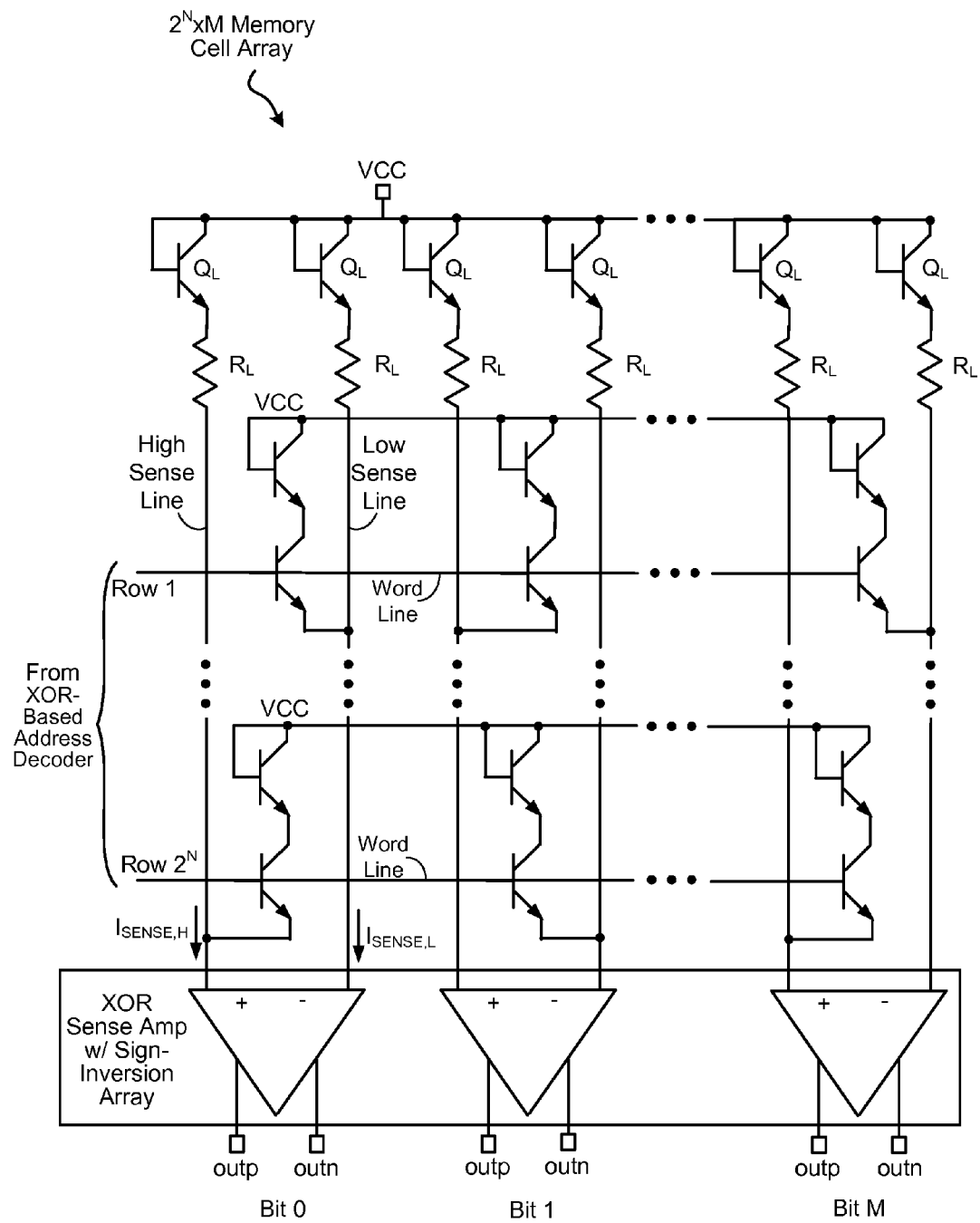
FIG. 4 is a schematic diagram of a $2^N \times M$ memory cell array configured in accordance with one embodiment of the present invention.

FIG. 4 is a schematic diagram of a $2^N \times M$ memory cell array configured in accordance with one embodiment of the present invention. The array itself can be, for example, a conventional differential ROM array. As will be appreciated, however, any number of memory cell configurations whether conventional or custom can be used in an embodiment of the present invention, and the specific array shown is provided for example purposes only. The present invention is not intended to be limited to any particular memory cell design or architecture.

As can be seen, the memory cell array is configured to receive single-ended inputs from the row decoder of FIG. 3, thereby allowing for row selection in the array. Each column of the array has differential signal lines (high sense line and low sense line) for driving the sense amplifiers (which are discussed with reference to FIG. 5). The bit cell can be any conventional or otherwise suitable bit cell construction. Here, the bottom transistor of each cell is the access device, and the top transistor of each bit cell connected in series with the access transistor effectively acts as a diode to maintain the transistor bias in proper range.

When the word line is selected (based on row signal provided by the row decoder), the access transistors for each bit of that word line (or row) are turned on, thereby causing a voltage/current difference between the high and low sense lines (where Isense,H is higher than Isense,L). This voltage difference can then be detected by the sense amplifier, which in response outputs a logic high or a logic low (depending on the bit stored in that cell). In typical operation, one of the rows Row 1 to Row $2^N$ lines is selected at any given time to provide this voltage difference. This array design uses a transistor to assign both a high and low bit value, which provides a larger signal at the sense amplifier input relative to other designs that only report a logical high. Recall, however, that any such array designs can benefit from embodiments of the present invention, and that the actual implementation of the memory cell array will depend on a number of factors such as desired die size and power constraints.

The previous discussion with reference to the circuitry of FIGS. 2 and 3, regarding how the components can be implemented with any suitable technology (e.g., HBT, CMOS, etc) as well as the particular implementation (e.g., system-on-chip or discrete components), is equally applicable here.

Sense Amplifier

Figure 5:
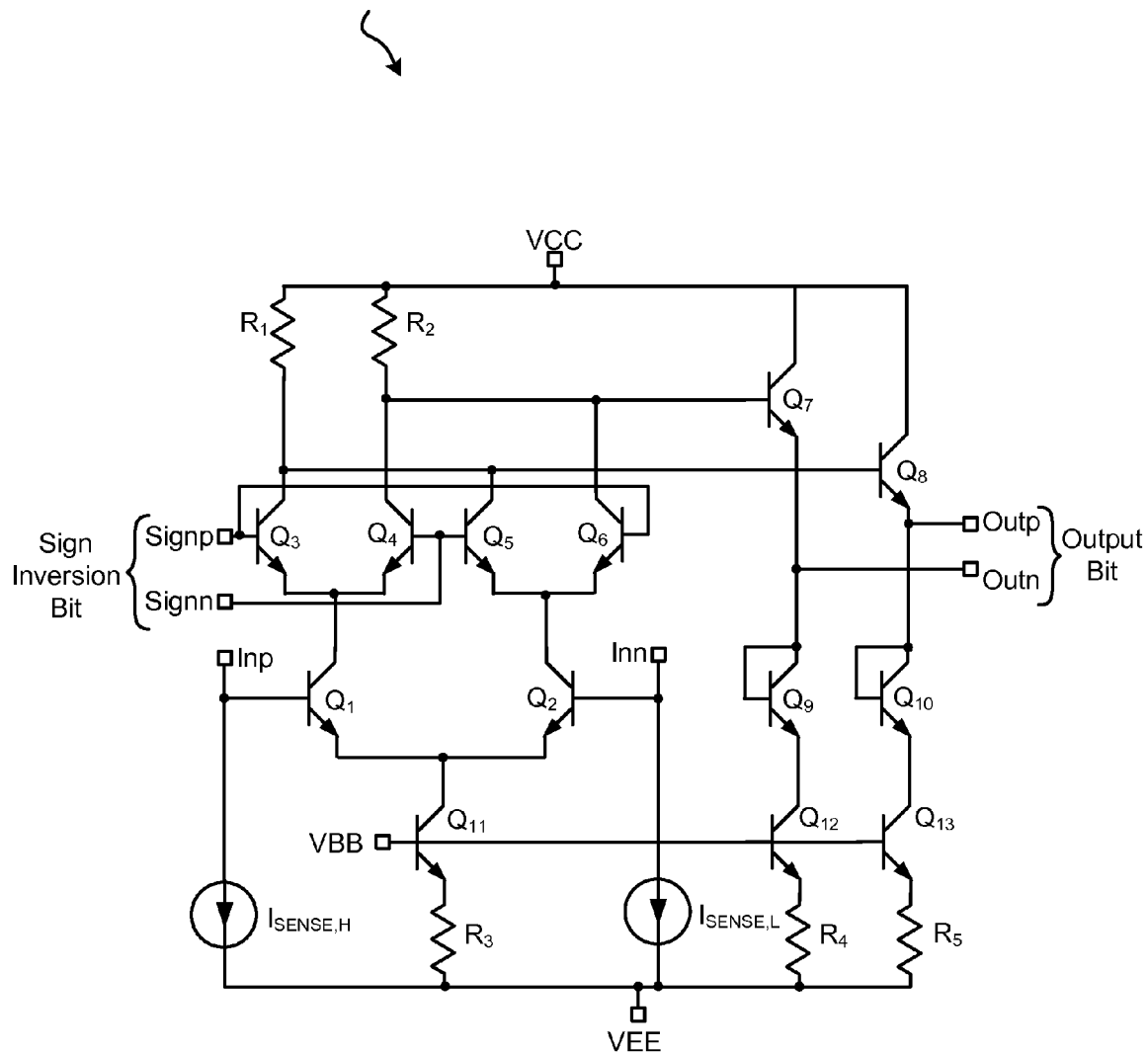
FIG. 5 is a schematic diagram of a sense amplifier configured with XOR functionality, in accordance with one embodiment of the present invention.

FIG. 5 is a schematic diagram of a sense amplifier configured with XOR functionality, in accordance with one embodiment of the present invention. As can be seen the sense amplifier with sign-inversion is configured and operates in a similar fashion to the address decoder buffer described with reference to FIG. 2. However, in the case of the sense amplifier, current sources Isense,H and Isense,L are used to provide a steady current to the differential memory array discussed with reference to FIG. 4. Otherwise, Inp, Inn, Signp, Signn, Outp, and Outn of FIG. 5 correspond to the description of Bp, Bn, Ap, An, Outp, and Outn of FIG. 2, respectively.

Thus, in this particular example embodiment, the corresponding sense signal comes in differentially (from the memory cell array of FIG. 4) on Inp and Inn (the base of Q1 and Q2 respectively). The output of the sense amplifier is also provided differentially, at Outp and Outn. Note that the differential output of the sense amplifier can be taken as a single-ended output (e.g., by taken Outp with reference to ground), if so desired. The sign-inversion signal is also received differentially on Signp and Signn, and can be used to perform sign-inversion differentially with respect to the sense signal received on Inp and Inn.

For instance, if the sense signal is high (Inp high, Inn low) and the sign-inversion signal is low (Signp low, Signn high), then the sense amplifier output will be high (Outp high, Outn low) and no sign-inversion is performed. This is because transistors Q1, Q4, and Q5 will be turned on, which draws current through R2, lowering the voltage on the base of transistor Q7 and the emitter of Q7 (Outn). Resistor R1, on the other hand, will not have current going through it (because transistors Q3 and Q6 are turned off), which means the base and emitter of transistor Q8 will be at a higher voltage than the base and emitter of transistor Q7.

Likewise, if the sense signal is high (Inp high, Inn low) and the sign-inversion signal is high (Signp high, Signn low), then the sense amplifier output will be low (Outp low, Outn high), and the output relative to the input is inverted (sign-inversion). This is because transistors Q1, Q3, and Q6 will be turned on, which draws current through R1, lowering the voltage on the base of transistor Q8 and the emitter of Q8 (Outn). Resistor R2, on the other hand, will not have current going through it (because transistors Q4 and Q5 are turned off), which means the base and emitter of transistor Q7 will be at a higher voltage than the base and emitter of transistor Q8.

The compression logic is effectively implemented with XOR logic using transistors Q3-Q6, and enables an integrated sign-inversion function in the sense amplifier circuitry. The XOR function in this example embodiment is implemented using a Gilbert cell configuration. However, other configurations may implement the XOR function with other logic functions, such as AND/OR-gates or NAND-gate, as will be apparent in light of this disclosure. In any case, when an array of sense amplifiers configured with XOR functionality is provided for a multi-bit input readout, the complimentary binary readout can be provided by the circuit. For instance, for a readout of 0010, a complementary readout of 1101 can be provided by setting the Signp/Signn input of each sense amplifier high (sign-inversion enabled). To disable the sign-inversion function, the Signp/Signn input of each buffer can be set low. As can further be seen, resistors R3, R4, and R5, along with transistors Q9, Q10, Q11, Q12, and Q13 and sources VCC, VEE, and VBB provide circuit biasing. As will be appreciated in light of this disclosure, sign-inversion is particularly useful when mapping quadrant I sine-wave data to quadrant III sine-wave data and quadrant IV sine-wave data.

The previous discussion with reference to the circuitry of FIGS. 2, 3, and 4 regarding how the components can be implemented with any suitable technology (e.g., HBT, CMOS, etc) as well as the particular implementation (e.g., system-on-chip or discrete components), is equally applicable here.

Compression

In general, the benefit of compression is that is allows a smaller memory size to be used, than would otherwise be needed if compression were not provided. The smaller memory is desirable for a number of reasons, including the fact that it takes up less space which is particularly beneficial in on-chip applications where physical space comes at a premium.

As will be appreciated, the XOR-gates in the address decoder and the sense amplifiers effectively operate to map a quarter sine-wave (with magnitude values stored within the ROM) to a full sine wave. In particular, the XOR-gates in the address decoder are used to reverse the address bits fed to the ROM. An accumulator with an upward counting binary address can be used to drive the binary address inputs ($B_1 \ldots B_N$), as typically done.

Figure 6A:
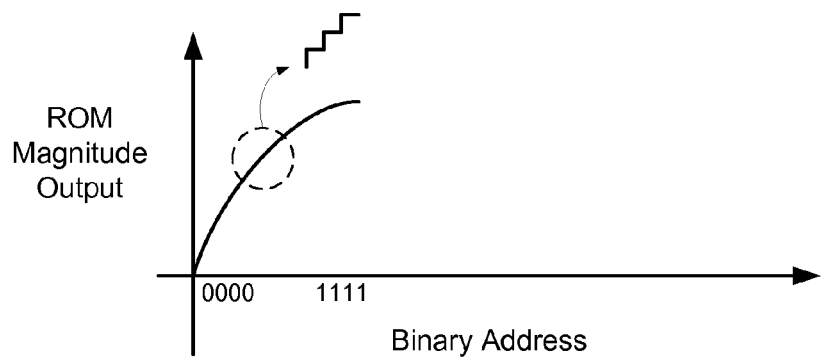
FIG. 6a illustrates an example quantized quarter sine-wave signal value that can be stored in a memory cell of a ROM, and mapped to a full quantized sine-wave, thereby providing a 4:1 compression.
Figure 6B:
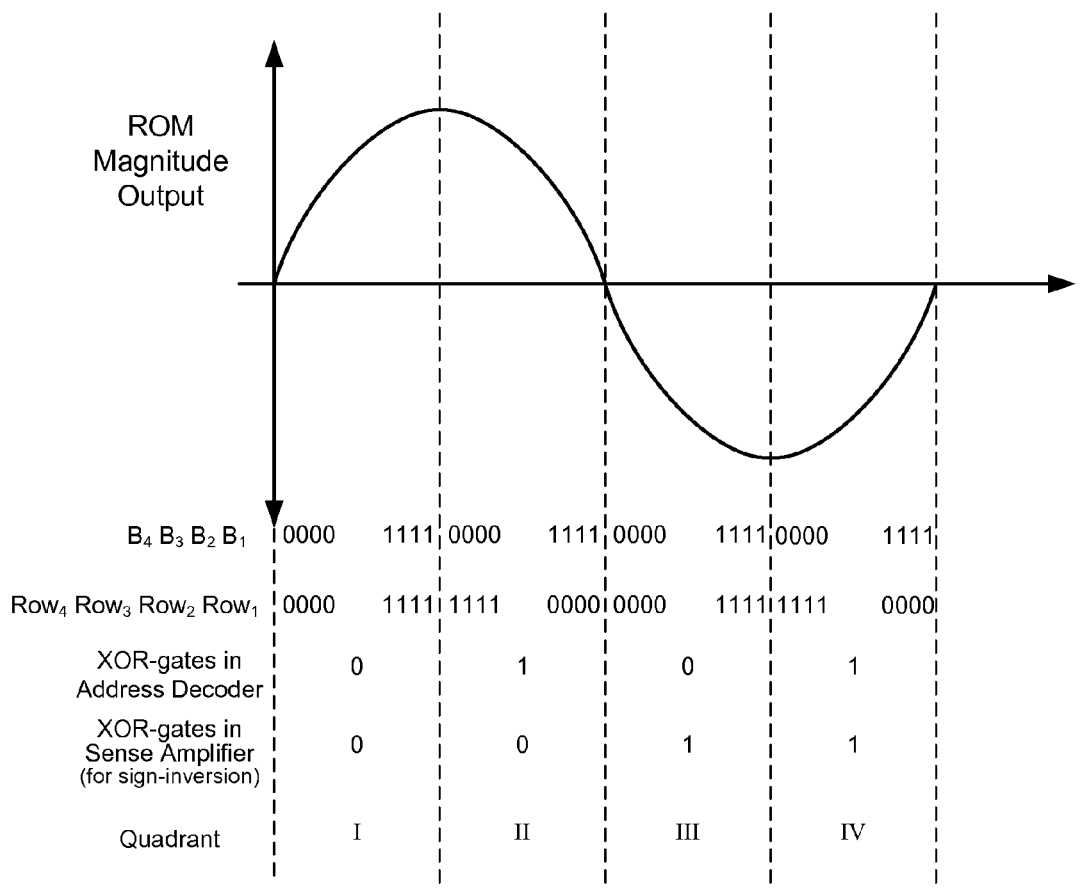
FIG. 6b illustrates how a quantized quarter sine-wave (with magnitude values stored within the ROM) can be mapped to a full quantized sine wave, in accordance with an embodiment of the present invention.

FIG. 6a illustrates an example quarter sine-wave signal value that can be stored in a memory cell of a ROM, and mapped to a full sine-wave, thereby providing a 4:1 compression, and FIG. 6b illustrates how that quarter sine-wave (with magnitude values stored within the ROM) can be mapped to a full sine wave, in accordance with an embodiment of the present invention. As can be seen, note that the sine wave is quantized rather than continuous to illustrate that the memory device stores binary data, as typically done.

FIGS. 6a and 6b show an example binary address ($B_4 B_3 B_2 B_1$) counting upwards in Quadrant I. However, in Quadrant II, the binary address $B_4 B_3 B_2 B_1$ must be reversed by setting all the differential address reversal bits (e.g., $A_4 A_3 A_2 A_1$, as discussed with reference to FIG. 2) to map the addresses properly so as to access the correct memory cells in the memory cell array, to map a quarter quantized sine-wave to a full quantized sine-wave. The XOR gates in the sense amplifiers reverse the magnitude of the outputs of the ROM.

So, referring to FIG. 6b, for Quadrants I and III, the address-inversion bits in the address decoder buffers are all set to 0. However for Quadrants II and IV, the address-inversion bits are all set to 1. In addition, for the first two Quadrants I and II, the sign-inversion bits in the sense amplifier are all set to 0. However for Quadrants III and IV, the sign-inversion bits are all set to 1. The benefit of compression provided by virtue of the integrated address and sign-inversion functionality is to allow use of a memory size that is 4× smaller than would be needed if all four quadrants of quantized sine-wave data had to be stored in the ROM.

Consider the example case where the memory cell is a $2^N \times M$ array, where N=4 bits and M=10 bits. In such an example case, there are 16 different addresses and the amplitude of the sine wave can be represented using 10 bits (or 0 to 255 in decimal). In such a case, there could be ten XOR based sense amps, with each sense amp having 16 different bit cells attached.

System

Figure 7:
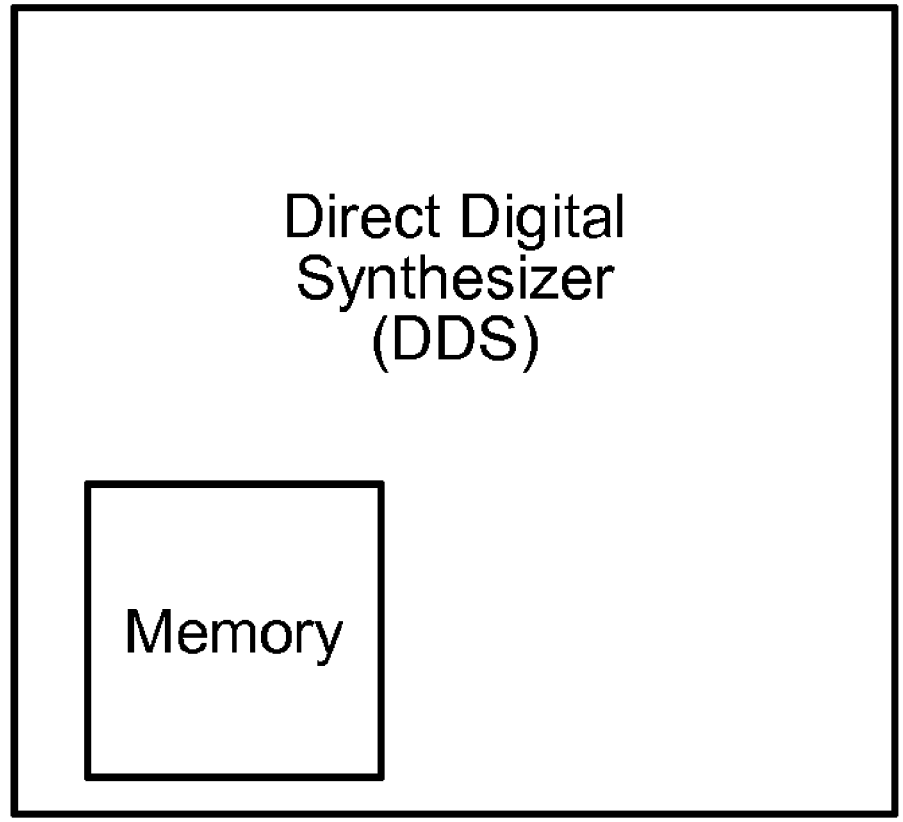
FIG. 7 is a direct digital synthesis (DDS) system configured in accordance with an embodiment of the present invention.

FIG. 7 is a direct digital synthesis (DDS) system configured in accordance with an embodiment of the present invention. As is known, a DDS system is configured for digitally creating arbitrary waveforms and frequencies from a single fixed source frequency. They are typically used, for example, as function generator. In any case, the DDS includes a memory, which can be implemented with a high-speed compression architecture as described herein. In one such example embodiment, the system is implemented as a system-on-chip configuration. Other systems that can benefit from a high-speed compression architecture memory will be apparent.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A memory device comprising:
   a memory cell array including rows and columns of bit cells for storing bit data;
   an address decoder having a plurality of buffers each operatively coupled to a corresponding row decoder configured for selecting a corresponding row of the memory cell array, each address decoder buffer configured with an integrated address reversal function; and
   a sense amplifier having a plurality of buffers each operatively coupled to a corresponding column of the memory cell array, each sense amplifier buffer configured with an integrated sign-inversion function;
   wherein the integrated address reversal and sign-inversion functions enable an X:1 compression ratio for the memory device with no increase in access time, where X is greater than 1.

2. The memory device of claim 1 wherein the integrated address reversal function of each address decoder buffer is implemented with an XOR logic function.

3. The memory device of claim 1 wherein the integrated sign-inversion function of each sense amplifier buffer is implemented with an XOR logic function.

4. The memory device of claim 1 wherein the integrated address reversal function of each address decoder buffer is implemented with a Gilbert cell configuration.

5. The memory device of claim 1 wherein the integrated sign-inversion function of each sense amplifier buffer is implemented with a Gilbert cell configuration.

6. The memory device of claim 1 wherein the integrated address reversal and sign-inversion functions enable a 4:1 compression ratio based on quadrant symmetry of signal stored at the provided memory address.

7. The memory device of claim 1 wherein the device is a differential non-volatile memory.

8. The device of claim 1 wherein the device is included in a system-on-chip configuration.

9. The device of claim 1 wherein the device is included in a digital signal generation system.

10. A memory device comprising:
    a memory cell array including rows and columns of bit cells for storing bit data;
    an address decoder having a plurality of buffers each operatively coupled to a corresponding row decoder configured for selecting a corresponding row of the memory cell array, each address decoder buffer configured with an integrated address reversal function that is implemented with an XOR logic function; and
    a sense amplifier having a plurality of buffers each operatively coupled to a corresponding column of the memory cell array, each sense amplifier buffer configured with an integrated sign-inversion function that is implemented with an XOR logic function;
    wherein the integrated address reversal and sign-inversion functions enable a 4:1 compression ratio for the memory device with no increase in access time.

11. The memory device of claim 10 wherein the integrated address reversal function of each address decoder buffer is implemented with a Gilbert cell configuration.

12. The memory device of claim 10 wherein the integrated sign-inversion function of each sense amplifier buffer is implemented with a Gilbert cell configuration.

13. The memory device of claim 10 wherein the device is a differential non-volatile memory.

14. The device of claim 10 wherein the device is included in a system-on-chip configuration.

15. A system, comprising:
    a direct digital synthesizer (DDS) operatively coupled with a memory device, the memory device comprising:
    cell array including rows and columns of bit cells for storing bit data;
    an address decoder having a plurality of buffers each operatively coupled to a corresponding row decoder configured for selecting a corresponding row of the memory cell array, each address decoder buffer configured with an integrated address reversal function; and
    a sense amplifier having a plurality of buffers each operatively coupled to a corresponding column of the memory cell array, each sense amplifier buffer configured with an integrated sign-inversion function;
    wherein the integrated address reversal and sign-inversion functions enable an X:1 compression ratio for the memory device with no increase in access time, where X is greater than 1.

16. The system of claim 15 wherein the device is implemented as a system-on-chip configuration.

17. The system of claim 15 wherein each of the integrated address reversal function of each address decoder buffer and the integrated sign-inversion function of each sense amplifier buffer is implemented with an XOR logic function.

18. The system of claim 15 wherein the integrated address reversal function of each address decoder buffer is implemented with a Gilbert cell configuration.

19. The system of claim 15 wherein the integrated sign-inversion function of each sense amplifier buffer is implemented with a Gilbert cell configuration.

20. The system of claim 15 wherein the integrated address reversal and sign-inversion functions enable a 4:1 compression ratio based on quadrant symmetry of signal stored at the provided memory address.

* * * * *